US006329070B1

(12) United States Patent
Sass et al.

(10) Patent No.: US 6,329,070 B1
(45) Date of Patent: Dec. 11, 2001

(54) FABRICATION OF PERIODIC SURFACE STRUCTURES WITH NANOMETER-SCALE SPACINGS

(75) Inventors: Stephen L. Sass; Christopher K. Ober; Yuri Suzuki, all of Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/730,587

(22) Filed: Dec. 7, 2000

Related U.S. Application Data
(60) Provisional application No. 60/169,951, filed on Dec. 9, 1999.

(51) Int. Cl.$^7$ .............................. B32B 7/00; C30B 33/06
(52) U.S. Cl. .............................. 428/612; 117/1; 117/902; 428/637; 428/641; 428/672; 428/687; 428/450; 428/926
(58) Field of Search ..................................... 428/612, 637, 428/641, 672, 687, 450, 926; 117/1, 902

(56) References Cited

U.S. PATENT DOCUMENTS

| 4,544,469 | 10/1985 | Boxall et al. . |
| 4,624,766 | 11/1986 | Boxall et al. . |
| 5,849,669 | 12/1998 | Wen . |
| 5,981,400 | 11/1999 | Lo . |

FOREIGN PATENT DOCUMENTS

| WO-01/00522-A2 | * 1/2001 | (WO) . |

OTHER PUBLICATIONS

F. S. Shieu and S. L. Sass, "Experimental and Theoretical Studies of the Disclocation Structure of NiO–PT Interfaces", Department of Materials Science and Engineering, Feb. 1990, vol. 38, No. 9, pp. 1653–1667.

A. Bourret, "How to Control the Self–Organization of Nanoparticles by Bonded Thin Layers", Surface Science 432 (1999), pp. 37–53 (no month given).

* cited by examiner

*Primary Examiner*—Robert R. Koehler
(74) *Attorney, Agent, or Firm*—Jones, Tullar & Cooper PC

(57) ABSTRACT

The periodic stress and strain fields produced by a pure twist grain boundary between two single crystals bonded together in the form of a bicrystal are used to fabricate a two-dimensional surface topography with controllable, nanometer-scale feature spacings (e.g., from 50 nanometers down to 1.5 nanometers). The spacing of the features is controlled by the misorientation angle used during crystal bonding. One of the crystals is selected to be thin, on the order of 5–100 nanometers. A buried periodic array of screw dislocations is formed at the twist grain boundary. To bring the buried periodicity to the surface, the thin single crystal is etched to reveal an array of raised elements, such as pyramids, that have nanometer-scale dimensions. The process can be employed with numerous materials, such as gold, silicon and sapphire. In addition, the process can be used with different materials for each crystal such that a periodic array of misfit dislocations is formed at the interface between the two crystals.

18 Claims, 3 Drawing Sheets

FABRICATION OF PERIODIC SURFACE STRUCTURES WITH NANOMETER-SCALE SPACINGS

CROSS REFERENCE TO RELATED APPLICATIONS

This application claims the benefit, under 35 USC 119(e), of U.S. Provisional Application No. 60/169,951, filed Dec. 9, 1999.

This invention arose out of research sponsored by the National Science Foundation (NSF) under Grant Nos. DMR-96-32275 and ECS-97-11208. The Government has certain rights in the invention.

BACKGROUND OF THE INVENTION

1. Field of the Invention

The present invention relates in general to a technique for fabricating patterned crystals having two dimensionally periodic surface structures with nanometer-scale spacings.

2. Description of the Background Art

As the demand for smaller and smaller electronic devices, magnetic recording media, etc., has increased, a need has been created for improved fabrication processes for making such devices. Many such devices are or can be typically formed on substrates that have two-dimensional patterns of periodic surface structures that are used for the subsequent formation of the devices. The reduced size demands for the devices require that the spacings between the periodic structures be on the order of less than 100 nm. Unfortunately, previously known techniques for forming nanometer-scale patterns are not commercially feasible. For example, a number of lithographic methods exist that can be used to form these types of patterned structures. These methods include creating patterns in polymers, called resists, using microlithography based on short wavelength UV radiation or electron beams. Patterns can be formed because the solubility of polymers is changed by the imaging radiation, and when exposed to a solvent a portion of the polymer film is removed quickly to create the image. However, producing dimensions on a length-scale of less than 100 nm using these techniques is difficult and can be carried out only using very special imaging tools and materials.

The tremendous success of scanning probe microscopes has opened the way for the development of another fabrication technique known as proximal probe lithography. Very briefly, proximal probe lithography involves the use of a scanning tunneling (STM) or atomic force microscope (AFM). The techniques range from using the STM to define a pattern in a medium which is subsequently replicated in the underlying material, to STM induced materials deposition, and STM and AFM manipulation of nanometer scale structures. However, there is a significant amount of instrumental evolution that needs to take place before these proximal probe techniques can be practical in a high throughput environment. As a result, a need therefore still remains for a technique that can be employed to form nanometer-scale periodic structures and arrays that is simple and commercially practical.

SUMMARY OF THE INVENTION

The present invention fulfills the foregoing need through provision of a technique for fabricating nanometer-scale periodic arrays in which two crystals, each comprised of single crystals of any suitable material, are bonded together misoriented at an angle relative to one another about a common surface normal, thereby forming a bicrystal structure. One of the crystals is selected to be thin, on the order of 5 to 100 nanometers. The presence of the misorientation angle results in the formation of a twist grain boundary between the two crystals that produces periodic stress and strain fields with spacings that are directly related to the misorientation angle, and are in the nanometer-scale range (e.g., from 50 nanometers down to 1.5 nanometers). At small misorientation angles, these stress and strain fields result from the presence of crystal defects, known as dislocations, at the interface between the crystals. Periodic surface structures with spacings that are the same as the spacings of the stress and strain fields can be exposed through a process such as etching. The spacings of these periodic structures are controlled by the misorientation angle used during bonding.

As an example, a thick and a thin gold (100) single crystal can be bonded together to form a bicrystal containing a small angle twist grain boundary. Subsequent etching of the thin single crystal exposes pyramidal features having nanometer scale dimensions. The subject technique is also suitable for use with other materials as well, including, for example, silicon and sapphire. The invention can also be used with two different materials bonded together to form a bicrystal that contains a periodic array of misfit dislocations at the interface. Again, by superimposing a twist misorientation, the spacing of the surface features can be varied by selection of the misorientation angle.

BRIEF DESCRIPTION OF THE DRAWINGS

The features and advantages of the invention will become apparent from the following detailed description of a preferred embodiment thereof, taken in conjunction with the accompanying drawings, in which.

DETAILED DESCRIPTION OF A PREFERRED EMBODIMENT

Figure 1:
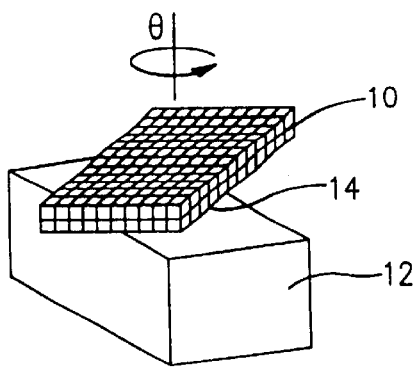
FIG. 1 is a schematic illustration of the geometry associated with the twist bonding of a thin (001) single crystal to a bulk (001) single crystal.

Turning now to a more detailed consideration of a preferred embodiment of the present invention, FIG. 1 illustrates the geometry associated with the twist bonding of a first, thin (001) single crystal 10 to a second, bulk (001) single crystal 12 misoriented by an angle θ about a common normal with respect to one another, thereby creating a twist grain boundary 14 between the two crystals 10 and 12. A twist grain boundary is a grain boundary between two crystals that have the same surface normal and are rotated with respect to one another about this normal.

Figure 2A:
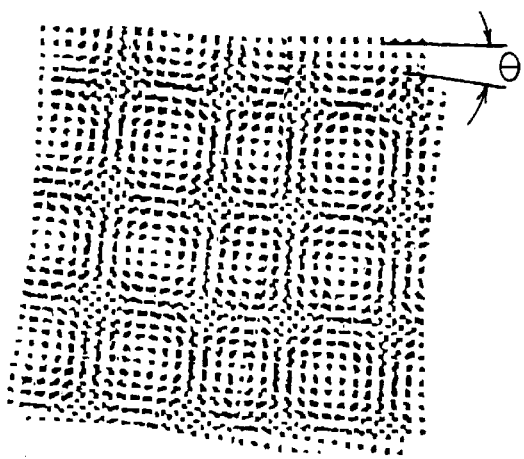
FIGS. 2A and 2B are graphical depictions of the Moiré pattern created by the two planes of atoms immediately adjacent to the grain boundary between two twist bonded crystals with no relaxation and with relaxation, respectively.
Figure 2B:
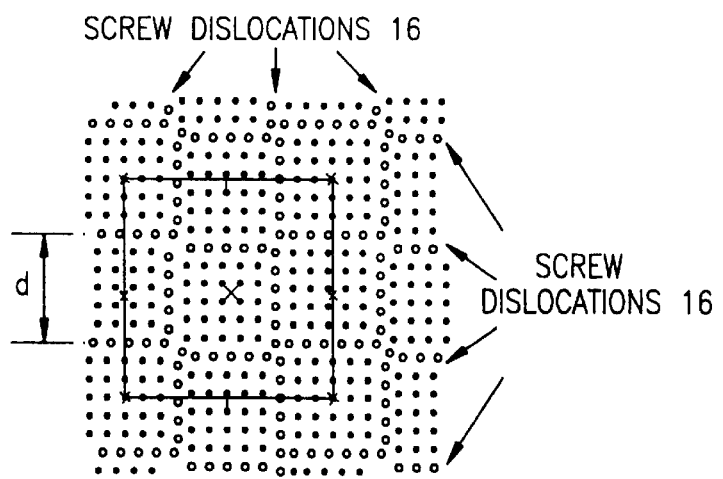

With reference to FIGS. 2A and 2B, when the two single crystals 10 and 12 are initially brought into contact, a misfit exists between the two lattices along the boundary plane if no structural relaxation occurs. FIG. 2A shows the Moiré pattern created by the two planes of atoms immediately adjacent to the grain boundary with no relaxation. This configuration is a high-energy state due to the high distortion in the atomic bond lengths across the grain boundary. However, when the crystals 10 and 12 are bonded together, the regions of high misfit relax into an array of screw dislocations 16 to reduce the grain boundary energy, thereby resulting in a grain boundary structure as shown in FIG. 2B. The planar periodic array of screw dislocations 16 formed in the twist boundary has an associated stress and strain field that penetrates a distance d into the neighboring single crystals. Thus, if the top crystal 10 is suitably thin, i.e. with thickness less than d, then the periodic stress and strain field of the buried grain boundary will influence the outer surface state of stress of the crystal 10, potentially inducing a structure with identical periodicity to that of the twist grain boundary. The preferable thickness of the top crystal substrate 10 is between 5 and 100 nanometers, with the most preferable thickness being between 30 and 50 nanometers. It should be noted that the thickness of the bulk crystal 12 is not important, but would typically be on the order of 500 microns.

Figure 3:
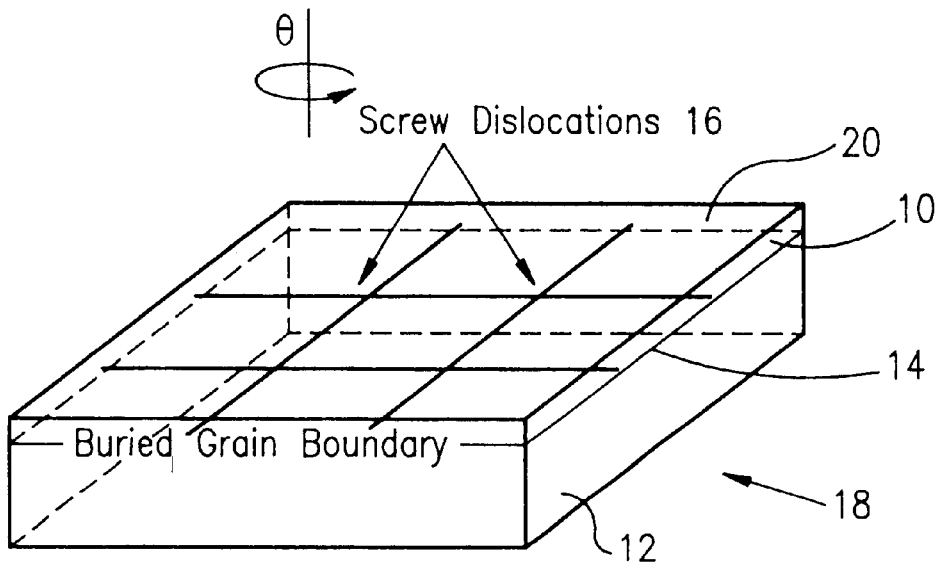
FIG. 3 is a schematic illustration of the dislocation array present at a buried twist grain boundary.

FIG. 3 shows a schematic diagram of a bicrystal structure 18 that is formed when the thin, top crystal 10 is bonded to the bottom, bulk crystal 12 misoriented by an angle θ about a common normal with respect to one another. The bonding creates the array of screw dislocations 16 that are present at the buried twist grain boundary 14. For small-angle boundaries, the dislocation spacing is determined by Frank's Rule, where b is the Burgers vector:

$$d \approx \frac{|b|}{\theta} \quad (1)$$

while the general equation is:

$$2d = |b|/\sin(\theta/2) \quad (2)$$

For all face-centered-cubic (f.c.c.) materials it is expected that the Burgers vector of the screw dislocations is of the form a/2<110>. Therefore, for f.c.c. gold $a_{Au}$=4.078 Å giving $|b_{Au}|$=2.884 Å. Table 1 shows the dislocation spacings for gold twist boundaries of various misorientation angles as calculated by Frank's Rule. As may be seen, the dislocation spacing ranges from 100 nanometers down to 1.5 nanometers as the misorientation angle is varied from 0.165° to 11.0°.

TABLE 1

Dislocation spacings in Au (100) twist boundaries

| Theta (°) | $d_{Au}$ (nm) |
|---|---|
| 0.165 | 100.0 |
| 0.33 | 50.0 |
| 0.7 | 23.6 |
| 1.0 | 16.5 |
| 1.5 | 11.0 |
| 2.0 | 8.3 |
| 3.0 | 5.5 |
| 4.0 | 4.1 |
| 6.0 | 2.8 |
| 8.0 | 2.1 |
| 11.0 | 1.5 |

Figure 4:
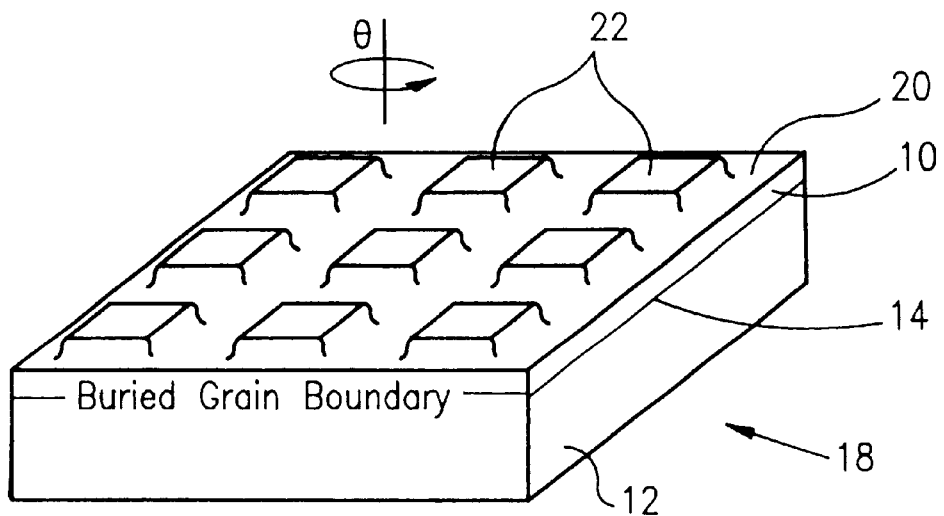
FIG. 4 is a schematic illustration of a bicrystal after etching.

If the top crystal 10 is suitably thin, then the stress and strain field produced by the buried grain boundary 14 will influence an exposed top surface 20 of the thin crystal 10. One way to bring the buried periodicity to the surface is to use an etchant (e.g., chemical etching, ion etching). Since the dislocation cores have higher energies than the surrounding regions, an etchant would attack these areas more rapidly than the areas between the dislocations. Regardless of the technique employed to expose the buried periodic structure resulting from the screw dislocations 16, the resultant bicrystal structure 18 will appear as illustrated in FIG. 4, with a two-dimensional periodic array of raised elements 22 being formed on the exposed top surface 20 of the thin crystal 10 having nanometer-scale spacings from one another.

Figure 5A:
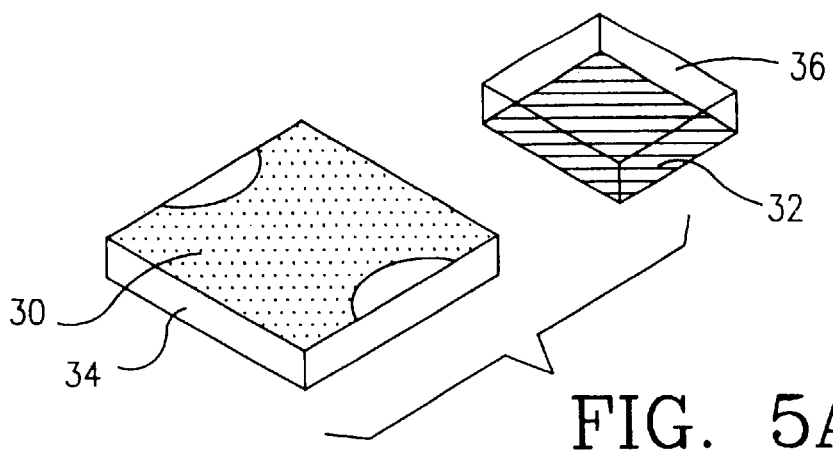
FIGS. 5A–5C are schematic illustrations showing one example of a bicrystal bonding process that can be employed in the present invention.
Figure 5B:
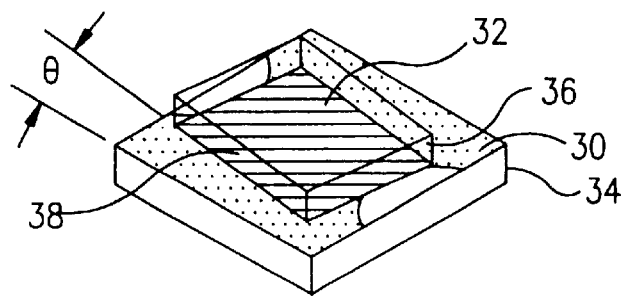
Figure 5C:
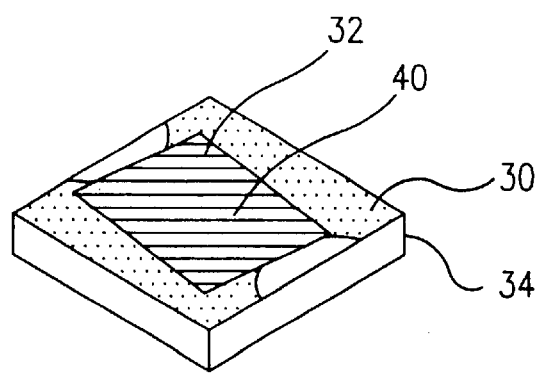

To prove that the theory of the present invention is correct, nanometer-scale surface structures were produced on the surface of gold bicrystals. The fabrication of gold periodic templates involves the following four steps as illustrated in FIGS. 5A–5C. First, as illustrated in FIG. 5A, both thick (500 nm) and thin (25–50 nm) (001) oriented Au single crystals 30 and 32 were produced by deposition on first and second (001) NaCl substrates 34 and 36, respectively. Next, the thick and thin Au crystals 30 and 32 were bonded together by heating for 1.5 hours at 325° C. under a load of ~1 MPA to form a twist grain boundary 38 as illustrated in FIG. 5B. The NaCl substrate 36 was removed from the thin Au crystal 32 by dissolution in water as illustrated in FIG. 5C. Finally, a top, exposed surface 40 of the thin crystal 32 was etched using a potassium iodide-iodine solution in water, to bring the buried periodicity to the surface.

To evaluate the resulting structure, transmission electron microscopy was used to characterize the buried grain boundary structure, while contact mode atomic force microscopy (AFM) was used to characterize the surface structure. The electron microscope image showed the presence of a square array of dislocations with 40-nanometer spacing, while the AFM images showed the presence of pyramidal features 7 nanometers high and 40 nanometers on edge.

The process of the subject invention can also be used to produce two dimensionally periodic surface structures in other materials, including silicon and sapphire. Each different material can be processed following the general scheme described above using conditions specific to that material. For silicon, the starting single crystals are in the form of a 0.5 mm thick single crystal wafer and a silicon-on-insulator (SOI) wafer, which consists of an ~100 nanometer thick silicon single crystal separated from the underlying silicon single crystal handle wafer by an ~400 nanometer thick silicon dioxide film. The bonding is carried out in the temperature range of 900 to 1200° C. under a 1.5 MPA load in a reducing atmosphere, such as hydrogen gas or a hydrogen-argon gas mixture. After bonding, the silicon handle wafer is removed from the thin single silicon crystal by etching the silicon dioxide film using hydrofluoric acid, leaving a specimen geometry as shown in FIG. 1. As before, etching of the silicon thin single crystal is then carried out, using one of several etchants, to bring the buried periodicity to the surface.

The process of the present invention can also be used with two different materials that are bonded together to form a bicrystal. In this case, a periodic array of misfit dislocations would be formed at the interface between the two crystals, and the spacing of the misfit dislocations would be determined by the difference in the lattice parameters between the two different materials. As before, the periodic spacing can be controlled by superimposing a twist misorientation upon the misfit structure.

The structures formed in accordance with the present invention have a number of applications. For example, they can be used as ultra-fine scale templates for biological and polymeric molecular assembly, for magnetic recording media and quantum dot arrays, and for nano-electronic applications.

Although the invention as been disclosed in terms of a preferred embodiment and variations thereon, it will be understood that numerous additional modifications and variations could be made thereto without departing from the scope of the invention as defined by the following claims.

What is claimed is:

1. A method for fabrication of nanometer-scale two dimensionally periodic surface structures comprising the steps of:

a) providing first and second crystals, said second crystal having a thickness of between 5 and 100 nanometers;

b) bonding said first and second crystals together misoriented at an angle about a surface normal of said first and second crystals, thereby forming a twist boundary between said first and second crystals and producing periodic stress and strain fields that generate a buried nanometer-scale periodic structure extending into said second crystal; and c) exposing said periodic structure.

2. The method of claim 1, wherein said step of exposing is carried out by etching said second crystal.

3. The method of claim 1, wherein said step of bonding further comprises bonding said first and second crystals at an angle of 11° or less so that said periodic structure includes a plurality of features that are spaced from one another by at least 1.5 nanometers.

4. The method of claim 1, wherein said second crystal is selected to have a thickness of between 30 and 50 nanometers.

5. The method of claim 1, wherein said first and second crystals are formed from the same material.

6. The method of claim 5, wherein said first and second crystals are formed from a material selected from the group consisting of gold, sapphire or silicon.

7. The method of claim 1, wherein said first and second crystals are formed of different materials.

8. The method of claim 7, wherein said first and second crystals are formed from different materials selected from the group consisting of gold, sapphire or silicon.

9. A bicrystal structure comprising:

a) first and second crystals, said second crystal having a thickness of between 5 and 100 nanometers and being bonded to said first crystal at an angle about a surface normal of said first and second crystal, thereby forming a twist boundary between said first and second crystals; and b) an exposed nanometer-scale periodic structure formed in said second crystal by periodic stress and strain fields produced by said twist boundary.

10. The structure of claim 9, wherein said first and second crystals are bonded at an angle of 11° or less, and said periodic structure includes a plurality of features that are spaced from one another by at least 1.5 nanometers.

11. The structure of claim 9, wherein said second crystal has a thickness of between 30 and 50 nanometers.

12. The structure of claim 9, wherein said first and second crystals are formed from the same material.

13. The structure of claim 12, wherein said first and second crystals are formed from a material selected from the group consisting of gold, sapphire or silicon.

14. The structure of claim 9, wherein said first and second crystals are formed of different materials.

15. The structure of claim 14, wherein said first and second crystals are formed from different materials selected from the group consisting of gold, sapphire or silicon.

16. The structure of claim 9, wherein said nanometer-scale periodic structure comprises a two dimensional array of raised elements.

17. The structure of claim 16, wherein said nanometer-scale periodic structure comprises a two dimensional array of pyramid shaped elements.

18. The structure of claim 16, wherein each of said elements in said array is spaced from an adjacent element in said array by 100 nm or less.

* * * * *